(12) United States Patent
Abbasi et al.

(10) Patent No.: US 9,041,474 B2
(45) Date of Patent: May 26, 2015

(54) PHASE LOCKED LOOP WITH BANDWIDTH CONTROL

(71) Applicants: Advanced Micro Devices, Inc., Sunnyvale, CA (US); ATI Technologies ULC, Markham (CA)

(72) Inventors: Saeed Abbasi, Valley Forge, PA (US); Nima Gilanpour, Toronto (CA); Michael R. Foxcroft, Toronto (CA); George A. W. Guthrie, Mississauga (CA); Raymond S. P. Tam, Richmond Hill (CA)

(73) Assignees: ADVANCED MICRO DEVICES, INC., Sunnyvale, CA (US); ATI TECHNOLOGIES ULC, Markham, Ontario ( * ) Notice: Subject to any disclaimer, the term of this patent is extended or adjusted under 35 U.S.C. 154(b) by 0 days.

(21) Appl. No.: 14/014,876

(22) Filed: Aug. 30, 2013

(65) Prior Publication Data

US 2015/0061737 A1    Mar. 5, 2015

(51) Int. Cl.
*H03L 7/093*  (2006.01)
*H03L 7/095*  (2006.01)
*H03L 7/07*   (2006.01)

(52) U.S. Cl.
CPC  *H03L 7/095* (2013.01); *H03L 7/07* (2013.01); *H03L 7/093* (2013.01); *Y10S 331/02* (2013.01)

(58) Field of Classification Search
CPC ....... H03L 7/087; H03L 7/095; H03L 7/1972; H03L 7/093

USPC ................. 327/147, 156; 331/10, 11, 16, 17, 331/DIG. 2; 375/373–376
See application file for complete search history.

(56) References Cited

U.S. PATENT DOCUMENTS

| | | | |
|---|---|---|---|
| 4,007,429 A * | 2/1977 | Cadalora et al. | 331/17 |
| 4,077,015 A * | 2/1978 | Carson et al. | 331/4 |
| 4,131,862 A * | 12/1978 | Black et al. | 331/4 |
| 4,516,083 A * | 5/1985 | Turney | 331/1 A |
| 4,525,686 A * | 6/1985 | Yokoya | 331/17 |
| 5,815,535 A * | 9/1998 | Choi et al. | 375/344 |
| 6,226,339 B1 * | 5/2001 | Nam et al. | 375/376 |
| 6,346,861 B2 * | 2/2002 | Kim et al. | 331/8 |
| 6,404,240 B1 * | 6/2002 | Hakkal et al. | 327/12 |
| 6,646,512 B2 | 11/2003 | Abassi | |
| 6,940,356 B2 * | 9/2005 | McDonald et al. | 331/16 |
| 7,369,002 B2 * | 5/2008 | Spijker et al. | 331/17 |
| 7,408,419 B2 * | 8/2008 | Ko | 331/17 |
| 7,728,675 B1 * | 6/2010 | Kennedy et al. | 331/16 |

\* cited by examiner

*Primary Examiner* — Levi Gannon
(74) *Attorney, Agent, or Firm* — Polansky & Associates, P.L.L.C.; Paul J. Polansky

(57) ABSTRACT

A phase locked loop (PLL) includes a first loop, a second loop, and a lock detector. The first loop locks a feedback signal having a frequency equal to a fraction of a frequency of an output signal to a reference signal in phase. The first loop has a first bandwidth. The second loop locks the feedback signal to the reference signal in frequency and has a second bandwidth. The first bandwidth is higher than the second bandwidth. The lock detector is coupled to the second loop and increases the second bandwidth in response to detecting that the feedback signal is not locked to the reference signal.

20 Claims, 4 Drawing Sheets

US 9,041,474 B2

PHASE LOCKED LOOP WITH BANDWIDTH CONTROL

FIELD

This disclosure relates generally to electronic circuits, and more specifically to phase locked loops (PLLs).

BACKGROUND

Various input/output (I/O) interfaces of digital integrated circuits use a PLL as a frequency synthesizer and also as a noise filter. A typical PLL includes a phase/frequency detector and a closed loop feedback divider. The feedback divider has a particular set of divider values based on a desired PLL output clock signal frequency. The phase-frequency detector compares the phase of a reference signal to an internal PLL feedback signal, and outputs a signal to adjust the frequency of the PLL clock output signal in a direction that eliminates the phase difference between the two signals. When the phase and frequency of the reference signal and the PLL clock output signal are aligned, the PLL output signal is "locked" to the reference signal.

As integrated circuits continue to operate with increasing data rates, the specifications of the associated PLLs become increasingly difficult to meet. For example, an amount of jitter that is allowed to propagate from the reference signal to the PLL output clock signal is one such specification. In particular, the amount of phase shift produced as a result of power supply noise, substrate noise, and capacitor loading, is directly related to how quickly the PLL can lock and correct the output frequency. Since the phase or frequency error is based on the operating frequency divided by the loop bandwidth, errors can be accumulated for a number of cycles. To compensate, some PLLs are implemented to position the loop bandwidth as close as possible to the reference frequency bandwidth. However, conservatively setting the bandwidth of a PLL generally corresponds to the PLL performing slow phase and frequency lock resulting in poor jitter performance over process, voltage, and temperature variations.

Figure 1:
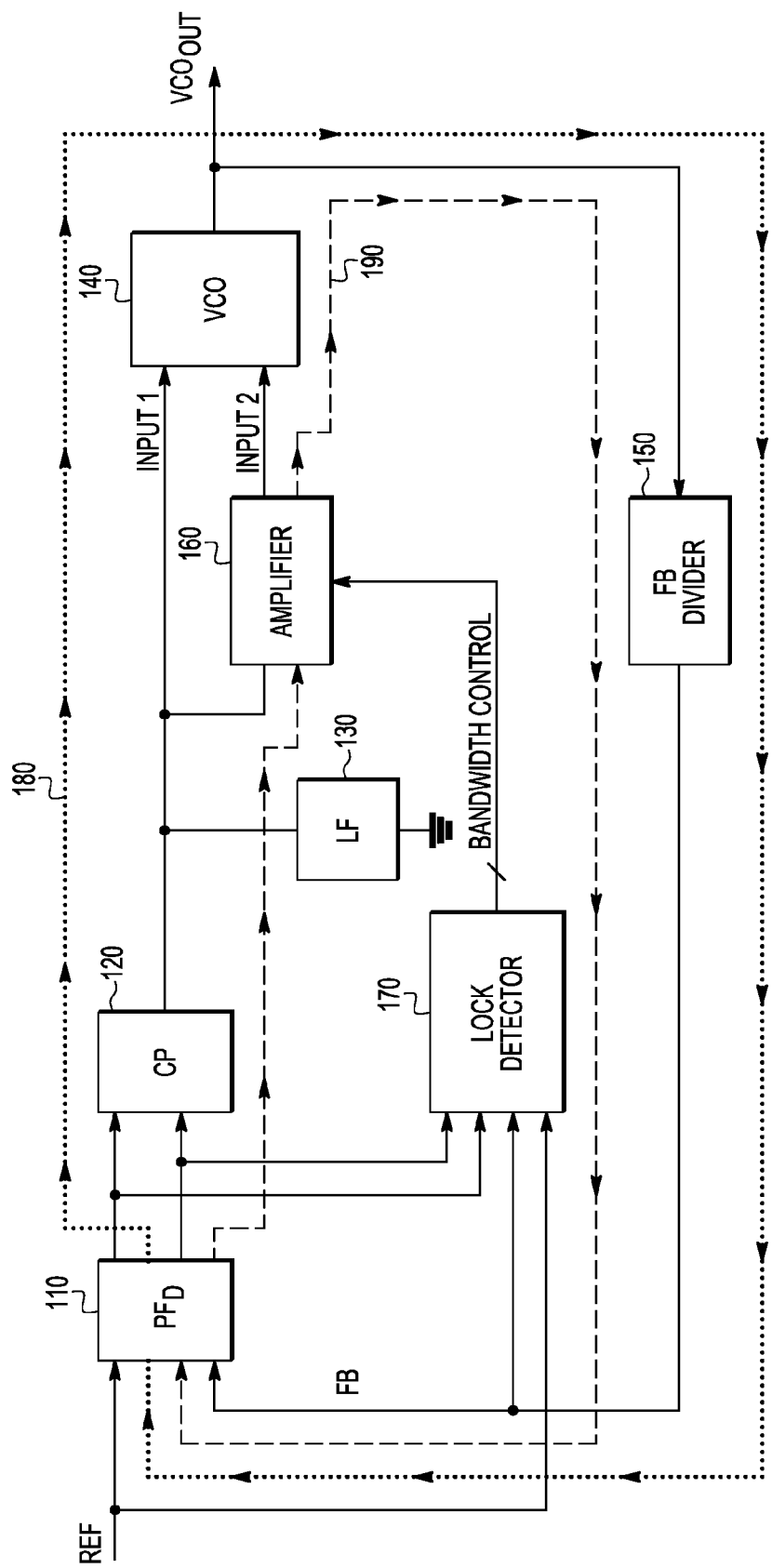
FIG. 1 illustrates in block diagram form a phase locked loop according to some embodiments.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

A PLL as disclosed below includes a first loop, a second loop, and a lock detector. The first loop locks a feedback signal that has a frequency equal to a fraction of a frequency of an output signal to a reference signal in phase and has a first bandwidth. The second loop locks the feedback signal to the reference signal in frequency and has a second bandwidth. The first bandwidth is higher than the second bandwidth. The lock detector is connected to the second loop and increases the second bandwidth in response to detecting that the feedback signal is not locked to the reference signal.

In some embodiments, the lock detector further has an input for defining a width of a locking window, and the feedback signal is locked in frequency to the reference signal when a certain edge of the feedback signal is within the width of the locking window of a corresponding edge of the reference signal. In some embodiments, the second loop includes an amplifier circuit that has an input connected to the output of the charge pump, a bandwidth control input connected to the lock detector, and an output that provides a second voltage on a second node based on a first voltage on the first node with a bandwidth based on the bandwidth control input. The VCO also has a second input connected to the second node, and provides the output signal at a frequency based on both the first voltage and the second voltage.

In some embodiments, the amplifier circuit includes a first operational transconductance amplifier that has a first input connected to the first node, a second input that receives a first reference voltage, and an output connected to the second node. The amplifier circuit also includes a second operational transconductance amplifier that has a first input connected to the first node, a second input that receives a second reference voltage, a control input that receives an enable signal, and an output connected to the second node. The amplifier circuit further includes a second loop filter connected to the second operational transconductance amplifier and develops a voltage on the second node.

Thus, a PLL as described herein includes a lock detector that can selectively increase the loop bandwidth of the PLL. In some embodiments, the lock detector increases the transconductance (Gm) of the amplifier circuit when the PLL is operating significantly out of lock, and decreases the Gm of the amplifier circuit to a narrow bandwidth when the PLL loop operates inside a defined near lock window state. The amplifier circuit of the second loop improves the rate at which the charge pump can charge and discharge the second loop filter, while the rising edges of the reference signal and the feedback signal are not concurrently inside the lock window state.

FIG. 1 illustrates in block diagram form a PLL 100 according to some embodiments. For the example shown in FIG. 1, PLL 100 includes a phase/frequency (PF) detector 110 labeled "PF$_D$", a charge pump 120 labeled "CP", a loop filter 130 labeled "LF", a voltage controlled oscillator 140 labeled "VCO", a feedback divider 150 labeled "FB DIVIDER", an amplifier circuit 160, and a lock detector 170, portions of which form a first loop 180 and a second loop 190.

PF detector 110 has a first input for receiving a reference clock signal labeled "REF", a second input for receiving a feedback clock signal labeled "FB", a first output, and a second output. CP 120 has a first input connected to the first output of PF detector 110, and a second input connected to the second output of PF detector 110, and an output for providing a signal labeled "INPUT 1". First LF 130 has a first terminal connected to the output of CP 120 for receiving the INPUT 1 signal, and a second terminal connected to ground. VCO 140 has a first input connected to the output of CP 120 for receiving the INPUT 1 signal, a second input for receiving a signal labeled "INPUT 2", and an output for providing a signal labeled "VCO$_{OUT}$". FB divider 150 has an input connected to the output of VCO 140 for receiving the VCO$_{OUT}$ signal, and an output connected to the second input of PF detector 110 for providing the FB signal. Amplifier circuit 160 has a first input connected to the output of CP 120 for receiving the INPUT 1 signal, a second input for receiving a set of signals labeled "BANDWIDTH CONTROL", and an output connected to the second input of VCO 140 for providing the INPUT 2 signal. Lock detector 170 has a first input connected to the second output of PF detector 110, a second input connected to the first output of PF detector 110, a third input connected to the output of FB divider 150 for receiving the FB signal, a fourth input for receiving the REF signal, and an output connected to the second input of amplifier circuit 160 for providing the set of BANDWIDTH CONTROL signals.

First loop 180 is formed by the path from PF detector 110, through CP 120, to the first input of VCO 140, through VCO 140 and FB divider 150 to the second input of PFD 110.

Second loop 190 is formed by the path from PF detector 110, through CP 120, to the input of amplifier circuit 160, through VCO 140 and FB divider 150 to the second input of PFD 110.

To achieve fast frequency and phase lock, PLL 100 selectively adjusts the loop bandwidth based on its locking state, for example a first state in which the VCO output is not locked to the reference clock, and a second state in which the VCO output is locked to the reference clock. In some embodiments, the locked state represents a state in which the phase and frequency of the reference clock signal and the feedback clock signal are within corresponding locking windows, and so the locked state actually signifies a near-lock condition rather than a perfectly locked condition. Lock detector 170 determines the locking state, and selectively controls amplifier circuit 160 of second loop 190 to increase the bandwidth in the first state, and thus reduce the locking time.

In operation, PLL 100 uses negative feedback using self-regulating circuitry to reduce fluctuations in the VCO$_{OUT}$ signal. When PLL 100 achieves a locked state, the phase/frequency of the VCO$_{OUT}$ signal is locked to the phase/frequency of the REF signal. PLL 100 provides the VCO$_{OUT}$ signal at an output clock frequency (f$_{OUT}$) associated with the input clock frequency (fREF) based on:

$$f_{OUT} = f_{REF} * N;$$ [1]

where FB divider 150 has divider circuitry based on a divider ratio of 1/N.

PF detector 110 monitors and compares the phase of the REF signal and the FB signal, and provides up and down output signals to CP 120 to remove a phase error between the REF signal and the FB signal. For example, if PF detector 110 detects an early rising edge of the REF signal in relation to the FB signal, PF detector 110 corrects the phase error by providing up signal pulses to speed up f$_{OUT}$. Alternately, if PF detector 110 detects a late rising edge of the REF signal in relation to the FB signal, PF detector 110 corrects the phase error by providing down signal pulses to slow down f$_{OUT}$. By the operation of the closed loop implementation of PLL 100, PF detector 110 assists VCO 140 with locking the phase and frequency of the VCO$_{OUT}$ signal to the REF signal, and in this way is considered to be a phase/frequency detector. In particular, PF detector 110 determines the difference between the REF signal and the FB signal based on the relationship f$_{OUT}$/N. If PF detector 110 detects a difference between the REF signal and the FB signal, PF detector 110 provides the up and down signals to CP 120, with a duration based on the amount of detected phase error.

Within first loop 180, the output of CP 120 is connected to a first node to convert the up and down signal digital error pulses, charge a filter capacitor in first LF 130, and provide the INPUT 1 signal to VCO 140 as an analog error current. First LF 130 integrates the analog error current by charging the filter capacitor to form the INPUT 1 signal as a control voltage to VCO 140.

VCO 140 responds to the voltage on the first and second nodes. For example, within first loop 180, VCO 140 provides the VCO$_{OUT}$ signal having f$_{OUT}$ proportional to the voltage formed on the INPUT 1 signal. VCO 140 also provides the VCO$_{OUT}$ signal as an input to FB divider 150, which outputs the FB signal as a fraction of the VCO$_{OUT}$ signal, by dividing the VCO$_{OUT}$ signal by a loop divider value N.

First loop 180 has a first characteristic bandwidth that affects PLL 100's response to jitter at the remote end and achieves phase lock between the FB and REF signals during the time PLL 100 has not yet locked and after PLL 100 locks. The bandwidth of first loop 180 is generally defined as the frequency where PLL 100 begins to lose lock with the REF signal. A particular bandwidth corresponds to the phase error, settling time, and jitter tracking capability of PLL 100. The bandwidth of first loop 180 is proportional to CP 120 current, VCO 140 gain, and the values of resistors and capacitors that are used to implement first LF 130.

Second loop 190 has a second characteristic bandwidth that also affects PLL 100's response to jitter at the remote end and achieves frequency lock between the FB and REF signals during the time PLL 100 has not yet locked and after PLL 100 locks. Within second loop 190, the output of amplifier circuit 160 is connected to a second node, and provides a second voltage on the INPUT 2 signal to VCO 140 that is based on the voltage formed on the first node. VCO 140 provides the VCO$_{OUT}$ signal at a frequency that is based on both the INPUT 1 and INPUT 2 signals. In some embodiments, amplifier circuit 160 develops a second voltage on the second node with a first bandwidth during the time PLL 100 has not yet locked the FB signal to the REF signal, and operates with a second bandwidth that is less than the first bandwidth after PLL 100 locks the FB signal to the REF signal.

Lock detector 170 provides BANDWIDTH CONTROL signals to amplifier circuit 160 to selectively boost the bandwidth of second loop 190. Second loop 190 has a second characteristic bandwidth that affects PLL 100's ability to lock the frequency of the FB signal to the frequency of the REF signal. Amplifier circuit 160 increases the bandwidth of second loop 190 during the time lock detector 170 detects the FB signal has not yet locked to the REF signal. In some embodiments, lock detector 170 can be programmed with different locking windows to detect both phase and frequency. For example, PF detector 110 provides the up and down signals to lock detector 170. Lock detector 170 defines a locking window width. The frequency of the FB signal is locked to the frequency of the REF signal when a certain edge of the FB signal and a corresponding edge of the REF signal are within the width of the locking window.

Thus, lock detector 170 selectively increases the loop bandwidth of second loop 190 based on the lock state of the PLL. In some embodiments, lock detector 170 increases the Gm of an operational transconductance amplifier (OTA) in amplifier circuit 160 when PLL 100 is not locked, and decreases the Gm of the OTA when PLL 100 is nearly locked, i.e. it operates inside a programmable near lock window state. In some embodiments, lock detector 170 causes amplifier circuit 160 to operate as a voltage follower when PLL 100 is not locked, causing second loop 190 to have the same bandwidth as first loop 180, and changes amplifier 160 to operate as a Gm amplifier that provides a current into a second loop filter when PLL 100 is locked, therefore causing second loop 190 to operate with a lower bandwidth. In either case, lock detector 170 causes second loop 190 to operate with a higher bandwidth when PLL 100 is not locked compared to when it has achieved a locked condition.

Figure 2:
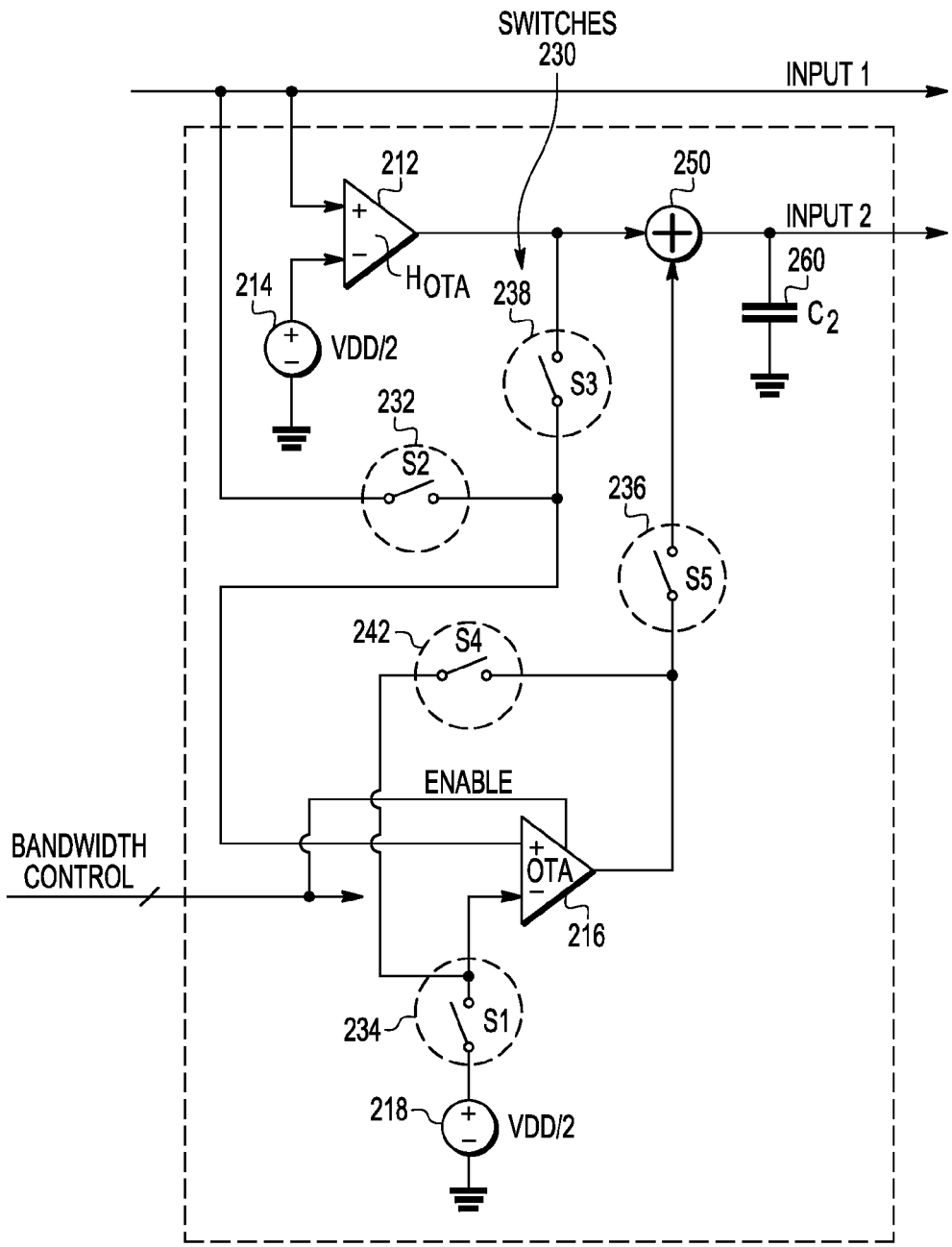
FIG. 2 illustrates in partial block diagram and partial schematic form a first amplifier circuit that may be used as the amplifier circuit of FIG. 1.

FIG. 2 illustrates in partial block diagram and partial schematic form an amplifier circuit 200 that may be used as amplifier circuit 160 of FIG. 1. For the example shown in FIG. 2, amplifier circuit 200 generally includes an operational transconductance amplifier 212 labeled "$H_{OTA}$", a reference voltage generator 214 labeled "VDD/2", an operational transconductance amplifier 216 labeled "OTA", a reference voltage generator 218 labeled "VDD/2", a multiple number of switches 230, a summer 250 labeled "+", and a second LF capacitor 260 labeled "$C_2$".

Operational transconductance amplifier 212 has a non-inverting input for receiving the INPUT 1 signal labeled "+", an inverting input labeled "−", and an output. Reference voltage generator 214 has a first terminal labeled "+" connected to the second input of operational transconductance amplifier 212, and a second terminal connected to a ground terminal labeled "−". Operational transconductance amplifier 216 has a non-inverting input labeled "+", an inverting input labeled "−", a third input for receiving one of the BANDWIDTH CONTROL signals labeled "ENABLE", and an output. Reference voltage generator 218 has a first terminal labeled "+", and a second terminal connected to a ground terminal labeled "−".

The multiple number of switches 230 includes a switch 232 labeled "S2", a switch 234 labeled "S1", a switch 236 labeled "S5", a switch 238 labeled "S3", and a switch 242 labeled "S4", each opened and closed in response to a respective one of the BANDWIDTH CONTROL signals that are not specifically identified in FIG. 2 but whose operation will be described below. Switch 232 has a first terminal connected to the INPUT 1 signal and a second terminal connected to the first input of operational transconductance amplifier 216 for connecting the INPUT 1 signal to the first input of operational transconductance amplifier 216 during a time PLL 100 has not yet locked. Switch 234 has a first terminal connected to the second input of operational transconductance amplifier 216 and a second terminal connected to the first terminal of reference voltage generator 218 for connecting the second input of operational transconductance amplifier 216 to the first terminal of reference voltage generator 218 during a time PLL 100 has not yet locked. Switch 236 has a first terminal connected to the output of operational transconductance amplifier 216 and a second terminal, for connecting the output of operational transconductance amplifier 216 to the second terminal during a time PLL 100 has not yet locked. Switch 238 has a first terminal connected to the output of operational transconductance amplifier 212 and a second terminal connected to the first input of operational transconductance amplifier 216 for connecting the output of operational transconductance amplifier 212 to the first input of operational transconductance amplifier 216 during a time PLL 100 is locked. Switch 242 has a first terminal connected to the output of operational transconductance amplifier 216 and a second terminal connected to the second input of operational transconductance amplifier 216 for connecting the output of operational transconductance amplifier 216 to the second input of operational transconductance amplifier 216 during a time PLL 100 is locked.

Summer 250 has a first input connected to the output of operational transconductance amplifier 212, a second input connected to the second terminal of switch 236, and an output for providing the signal INPUT 2 signal to the VCO.

Second LF capacitor 260 has a first terminal connected to the output of summer 250 for receiving the INPUT 2 signal, and a second terminal connected to the ground terminal.

In operation, operational transconductance amplifiers 212 and 216 provide output currents based on the differences between the voltage on the INPUT 1 signal and the voltage on the first terminal of reference voltage generators 214 and 218, respectively. For the example in FIG. 2, reference voltage generators 214 and 218 provide a voltage on their corresponding first terminals that is about half the power supply terminal voltage (VDD/2).

Each one of multiple switches 230 is represented in FIG. 2 as a simple single pole, single throw, on/off switch. Lock detector 170 provides selected BANDWIDTH CONTROL signals to control corresponding switches, and connects the first terminal to the second terminal for each of switches 232, 234, and 236, during the time PLL 100 has not yet locked. Alternately, lock detector 170 provides selected BANDWIDTH CONTROL signals, and connects the first terminal to the second terminal for each of switches 238 and 242, during the time PLL 100 is locked.

During the time PLL 100 has not yet locked, lock detector 170 activates a BANDWIDTH CONTROL signal labeled "ENABLE" to enable operational transconductance amplifier 216. When enabled, operational transconductance amplifier 216 boosts the bandwidth of amplifier circuit 200.

After PLL 100 has locked, e.g. is in the near-lock state, lock detector 170 deactivates the ENABLE signal to disable operational transconductance amplifier 216. PLL 100 uses first loop 180 and operational transconductance amplifier 212 to maintain lock, and to make phase corrections when an edge of the FB signal is within the width of a locking window of a corresponding edge of the REF signal. Amplifier circuit 200 has a first gain while PLL 100 has not yet locked the frequency of the FB signal to the frequency of the REF signal, and a second gain less than the first gain after PLL 100 has locked the frequency of the FB signal to the frequency of the REF signal.

To boost the bandwidth of PLL 100 while PLL 100 has not yet locked, e.g. is not in the near-lock state, summer 250 adds the current provided by operational transconductance amplifier 212 to the current provided by operational transconductance amplifier 216 and LF capacitor 260 converts the current to a voltage on the INPUT 2 signal. VCO 140 provides the $VCO_{OUT}$ signal at a frequency that is based on both the INPUT 1 and the INPUT 2 signals.

Thus, amplifier circuit 200 allows second loop 190 to operate with a higher bandwidth until PLL 100 is locked, and then to operate with a lower bandwidth afterward to reduce jitter.

Figure 3:
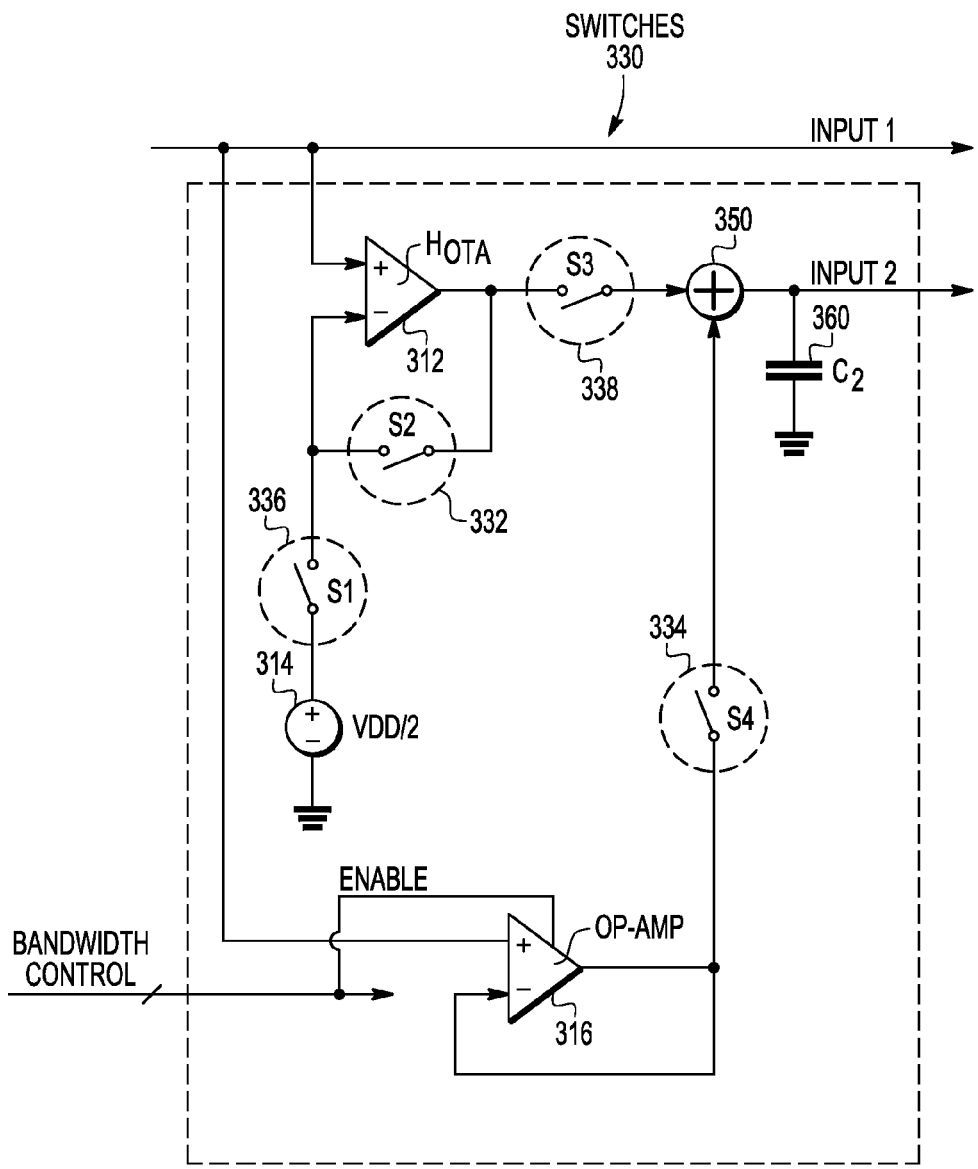
FIG. 3 illustrates in partial block diagram and partial schematic form a second amplifier circuit that may be used as the amplifier circuit of FIG. 1.

FIG. 3 illustrates in partial block diagram and partial schematic form an amplifier circuit 300 that may be used as amplifier circuit 160 of FIG. 1. For the example shown in FIG. 3, amplifier circuit 300 generally includes an operational transconductance amplifier 312 labeled $H_{OTA}$, a reference voltage generator 314 labeled "VDD/2", an operational amplifier 316 labeled "OP-AMP", a multiple number of switches 330, a summer 350 labeled "+", and a LF capacitor 360 labeled "$C_2$".

Operational transconductance amplifier 312 has a non-inverting input for receiving the INPUT 1 signal labeled "+", an inverting input labeled "−", and an output. Reference voltage generator 314 has a first terminal labeled "+", and a second terminal connected to a ground terminal labeled "−". Operational amplifier 316 has a non-inverting input for receiving the INPUT 1 signal labeled "+", an inverting input labeled "−", a third input for receiving the ENABLE signal, and an output connected to the second input.

The multiple number of switches 330 includes a switch 332 labeled "S2", a switch 334 labeled "S4", a switch 336 labeled "S1", and a switch 338 labeled "S3", each opened and closed in response to a respective one of the BANDWIDTH CONTROL signals that are not specifically identified in FIG. 3 but whose operation will be described below. Switch 332 has a first terminal connected to the output of operational transconductance amplifier 312 and a second terminal connected to the second input of operational transconductance amplifier 312 for connecting the output of operational transconductance amplifier 312 to the second input of operational transconductance amplifier 312 during a time PLL 100 has not yet locked. Switch 334 has a first terminal connected to the output of operational amplifier 316 and a second terminal for connecting the output of operational amplifier 316 to the second terminal during a time PLL 100 has not yet locked. Switch 336 has a first terminal connected to the first terminal of reference voltage generator 314 and a second terminal connected to the second input of operational transconductance amplifier 312 for connecting the first terminal of reference voltage generator 314 to the second input of operational transconductance amplifier 312 during a time PLL 100 is locked. Switch 338 has a first terminal connected to the output of operational transconductance amplifier 312 and a second terminal for connecting the output of operational transconductance amplifier 312 to the second terminal during a time PLL 100 is locked.

Summer 350 has a first input connected to the second terminal of switch 338, a second input connected to the second terminal of switch 334, and an output for providing the INPUT 2 signal to the VCO.

LF capacitor 360 has a first terminal connected to the output of summer 350 for receiving the INPUT 2 signal, and a second terminal connected to ground.

In operation, operational transconductance amplifier 312 provides an output current based on the difference between the voltage on the INPUT 1 signal and the voltage on the first terminal of reference voltage generator 314. For the example in FIG. 3, reference voltage generator 314 provides a voltage on its first terminal that is half the power supply terminal voltage (VDD/2). Operational amplifier 316 provides its output back to its second input to make it a unity-gain amplifier, such that the voltage on the output of operational amplifier 316 is subtracted from the voltage on the INPUT 1 signal (the first node). Operational amplifier 316 adjusts its output voltage by following the voltage on the INPUT 1 signal, and has a voltage gain substantially equal to unity.

Each one of multiple switches 330 is represented in FIG. 3 as a simple single pole, single throw, on/off switch. Lock detector 170 activates selected BANDWIDTH CONTROL signals to close switches 332 and 334 during the time PLL 100 has not yet locked. Alternately, lock detector 170 activates selected BANDWIDTH CONTROL signals to close switches 336 and 338 during the time PLL 100 is locked.

During the time PLL 100 has not yet locked, lock detector 170 activates the ENABLE signal to operational amplifier 316 to enable it to boost the bandwidth of amplifier circuit 300. For the example implementation shown in FIG. 3, lock detector 170 also configures operational transconductance amplifier 312 in a "self-biased" implementation, and switches it out of amplifier circuit 300. During the time PLL 100 has not yet locked, first loop 180 and second loop 190 have the same bandwidth, causing PLL 100 to effectively operate as a single loop PLL while it approaches a near-lock state.

After PLL 100 has reached the near-lock state, lock detector 170 opens switch S4 and disables unity-gain amplifier 316. PLL 100 operates as a dual-loop PLL (first loop 180 and second loop 190). PLL 100 uses first loop 180 and operational transconductance amplifier 212 to maintain lock, and to make phase corrections when an edge of the FB signal is within the width of a locking window of a corresponding edge of the REF signal. Note that amplifier circuit 300 has a higher bandwidth while PLL 100 has not yet locked, and a lower bandwidth after PLL 100 reaches the near-lock state.

To boost the bandwidth of PLL 100 while PLL 100 has not yet reached the near-lock state, lock detector 170 controls operational amplifier 316 to operate as a unity-gain amplifier, and causes INPUT 2 to substantially follow INPUT 1 as long as the output impedance of operational amplifier 316 is sufficiently low. Thus second loop 190 operates with the same bandwidth as first loop 180, and PLL 100 effectively operates as a one-loop PLL. After PLL 100 achieves the near-lock state, lock detector 170 closes switches S1 and S3 and opens switch S4 and the second loop 190 operates with a bandwidth defined by the Gm of OTA 312 and the capacitance of LF capacitor 360.

Thus, amplifier circuit 300 allows second loop 190 to operate with a higher bandwidth until PLL 100 achieves the near-lock state, and then to operate with a lower bandwidth afterward to reduce jitter.

Figure 4:
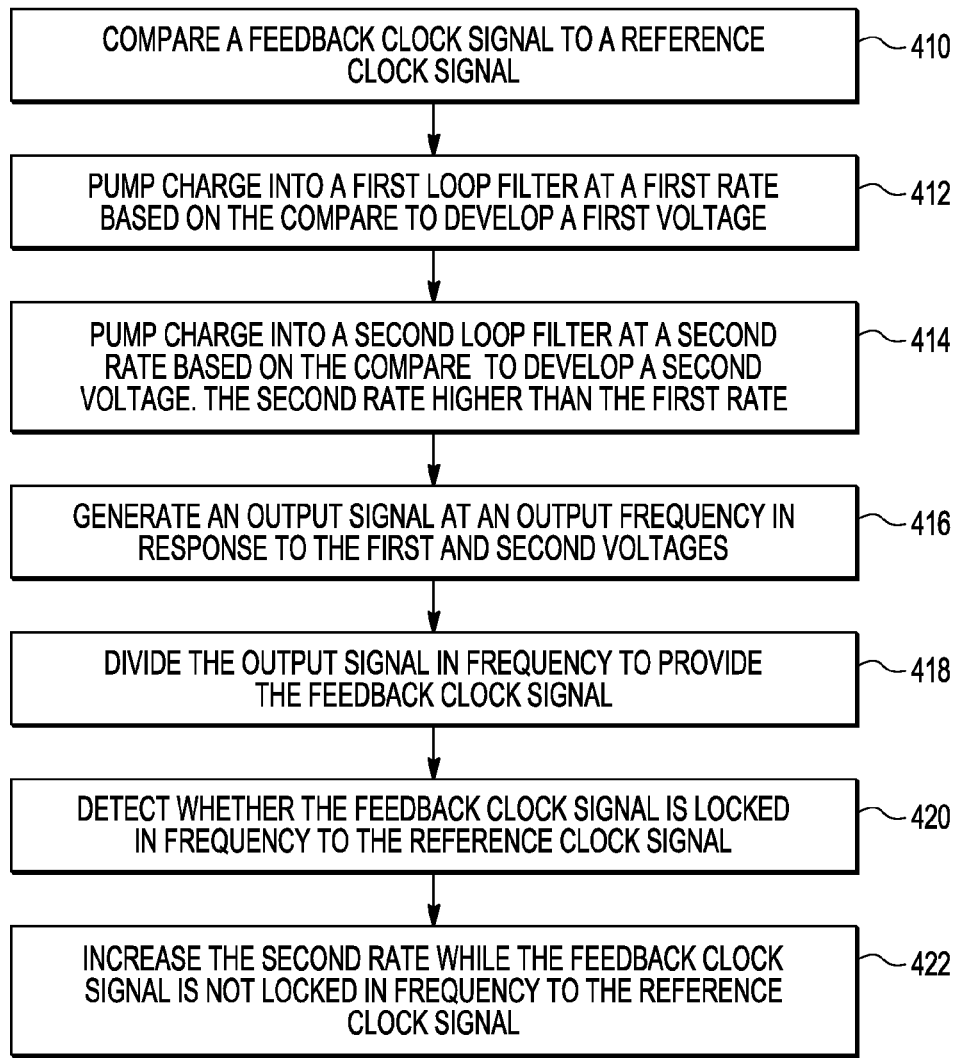
FIG. 4 illustrates a flow diagram of a method for generating a clock signal in response to first and second voltages according to some embodiments.

FIG. 4 illustrates a flow diagram of a method 400 for generating a clock signal in response to first and second voltages according to some embodiments. Action box 410 includes comparing a feedback clock signal to a reference clock signal. Action box 412 includes pumping charge into a first loop filter at a first rate based on the compare to develop a first voltage. Action box 414 includes pumping charge into a second loop filter at a second rate based on the compare to develop a second voltage, the second rate higher than the first rate. In some embodiments, pumping charge into the second loop filter includes continuously pumping charge into the second loop filter in response to a voltage of the first loop filter, and selectively pumping additional charge into the second loop filter in response to a voltage of the first loop filter. In some embodiments, the selectively pumping includes pumping the additional charge into the second loop filter in response to the voltage of the first loop filter while the feedback clock signal is not locked in frequency to the reference clock signal. In some embodiments, selectively pumping includes selectively pumping the additional charge into the second loop filter at a programmable rate.

Action box 416 includes generating an output signal at an output frequency in response to the first and second voltages. Action box 418 includes dividing the output signal in frequency to provide the feedback clock signal. Action box 420 includes detecting whether the feedback clock signal is locked in frequency to the reference clock signal. Action box 422 includes increasing the second rate while the feedback clock signal is not locked in frequency to the reference clock signal.

Thus, a PLL as described herein includes a lock detector that can widen the loop bandwidth of the PLL. In some embodiments, the lock detector increases the Gm of the amplifier circuit when the PLL is operating significantly out of lock, and decreases the Gm of the amplifier circuit to narrow the bandwidth when the PLL loop is locked, i.e. it operates inside a defined near-lock window state. The amplifier circuit of the second loop improves the rate at which the charge pump can charge and discharge the second loop filter before the PLL has achieved a near-lock state, while the rising edges of the reference signal and the feedback signal are not concurrently inside the lock window state.

The functions of PLL 100 of FIG. 1, amplifier circuit 200 of FIG. 2, and amplifier circuit 300 of FIG. 3 may be implemented with various combinations of hardware and software. For example, some functions of lock detector 170 may be determined by an operating system, firmware, or software drivers, and stored as a table in non-volatile memory. Some of the software components may be stored in a computer readable storage medium for execution by at least one processor. Moreover the method illustrated in FIG. 4 may also be governed by instructions that are stored in a computer readable storage medium and that are executed by at least one processor. Each of the operations shown in FIG. 4 may correspond to instructions stored in a non-transitory computer memory or computer readable storage medium. In various embodiments, the non-transitory computer readable storage medium includes a magnetic or optical disk storage device, solid-state storage devices such as Flash memory, or other non-volatile memory device or devices. The computer readable instructions stored on the non-transitory computer readable storage medium may be in source code, assembly language code, object code, or other instruction format that is interpreted and/or executable by one or more processors.

Any of the current generators of FIGS. 2-4 may be described or represented by a computer accessible data structure in the form of a database or other data structure which can be read by a program and used, directly or indirectly, to fabricate integrated circuits with the circuits of FIG. 2, 3, or 4. For example, these circuits may be drawn with a schematic capture tool which will generate a netlist or entered directly as a netlist. The netlist comprises a set of circuit elements which also represent the functionality of the hardware comprising an integrated circuit with the circuits of FIG. 2, 3, or 4. The netlist may then be laid out to produce a data set describing geometric shapes to be applied to masks. The masks may then be used in various semiconductor fabrication steps to produce integrated circuits using the circuits of FIG. 2, 3, or 4. Alternatively, the database on the computer accessible storage medium may be the netlist (with or without the synthesis library) or the data set, as desired, or Graphic Data System (GDS) II data.

While particular embodiments have been described, various modifications to these embodiments will be apparent to those skilled in the art. For example, any combination of PLL 100, PF detector 110, CP 120, first loop filter 130, VCO 140, FB divider 150, amplifier circuit 160, lock detector 170, first loop 180, and second loop 190, could each use a common circuit design or different circuit designs. Also, any combination of these circuits could be formed on a single integrated circuit or could be formed on multiple integrated circuits.

Accordingly, it is intended by the appended claims to cover all modifications of the disclosed embodiments that fall within the scope of the disclosed embodiments.

What is claimed is:

1. A phase locked loop comprising:
    a first loop for locking a feedback signal having a frequency equal to a fraction of a frequency of an output signal to a reference signal in phase and having a first bandwidth;
    a second loop for locking said feedback signal to said reference signal in frequency and having a second bandwidth, wherein said first bandwidth is higher than said second bandwidth; and
    a lock detector coupled to said second loop for increasing said second bandwidth in response to detecting that said feedback signal is not locked to said reference signal, wherein said lock detector further has an input for defining a width of a locking window, and said feedback signal is locked in frequency to said reference signal when a predetermined edge of said feedback signal is within said width of said locking window of a corresponding edge of said reference signal.

2. The phase locked loop of claim 1, wherein said feedback signal is locked to said reference signal when said feedback signal is locked in frequency to said reference signal.

3. The phase locked loop of claim 1, wherein said lock detector further has an output for providing a bandwidth control signal, and said second loop further comprises an amplifier, wherein said amplifier in responsive to said bandwidth control signal for selectively increasing said second bandwidth.

4. The phase locked loop of claim 1 wherein said first loop comprises:
    a phase/frequency detector having a first input for receiving a reference clock signal, a second input for receiving a feedback signal, and an output;
    a charge pump having an input coupled to said output of said phase/frequency detector, and an output coupled to a first node;
    a first loop filter coupled to said charge pump for developing a first voltage on said first node;
    a voltage controlled oscillator having a first input coupled to said first node, and an output for providing said output signal at a frequency responsive to said first voltage; and
    a feedback divider having an input coupled to said output of said voltage controlled oscillator, and an output coupled to said second input of said phase/frequency detector.

5. The phase locked loop of claim 4 wherein:
    said second loop comprises an amplifier circuit having an input coupled to said output of said charge pump, a bandwidth control input coupled to said lock detector, and an output for providing a second voltage on a second node in response to said first voltage on said first node with a bandwidth based on said bandwidth control input; and
    said voltage controlled oscillator further has a second input coupled to said second node, and provides said output signal at a frequency responsive to both said first voltage and said second voltage.

6. The phase locked loop of claim 5, wherein said second loop further comprises said phase/frequency detector, said charge pump, said first loop filter, said voltage controlled oscillator, and said feedback divider.

7. The phase locked loop of claim 5, wherein said amplifier circuit comprises:
    a first amplifier having a first input coupled to said first node, a second input for receiving a first reference voltage, and an output coupled to said second node;
    a second amplifier having a first input coupled to said first node, a second input for receiving a second reference voltage, a control input for receiving an enable signal, and an output coupled to said second node; and
    a second loop filter coupled to said second amplifier for developing a voltage on said second node.

8. The phase locked loop of claim 7, wherein said first and second amplifiers are operational transconductance amplifiers coupled to said second node through a summer.

9. The phase locked loop of claim 5, wherein said amplifier circuit comprises:
    an amplifier having a first input coupled to said first node, a second input for receiving a reference voltage, and an output coupled to said second node;
    a unity-gain amplifier having a non-inverting input coupled to said first node, an inverting input, a control input for receiving an enable signal, and an output coupled to said inverting input and to said second node; and a second loop filter coupled to said unity-gain amplifier for developing a voltage on said second node.

10. The phase locked loop of claim 9, wherein said lock detector disables said unity-gain amplifier when said phase locked loop has locked said feedback signal to said reference signal in frequency, and enables said unity-gain amplifier while said phase locked loop has not yet locked said feedback signal to said reference signal in frequency after said phase locked loop has locked said feedback signal to said reference signal in frequency.

11. A phase locked loop comprising:
a phase/frequency detector having a first input for receiving a reference clock signal, a second input for receiving a feedback signal, and an output;
a charge pump having an input coupled to said output of said phase/frequency detector, and an output coupled to a first node;
a first loop filter having an input coupled to said charge pump for developing a first voltage on said first node for locking said feedback signal to said reference signal in phase;
an amplifier circuit for providing a current to a second node in response to said voltage on said first node, and for developing a second voltage on said second node for locking said feedback signal to said reference signal in frequency;
a voltage controlled oscillator having a first input coupled to said first node, a second input coupled to said second node, and an output for providing an output signal at a frequency responsive to said first and second voltages;
a feedback divider having an input coupled to said output of said voltage controlled oscillator, and an output coupled to said second input of said phase/frequency detector; and
a lock detector for boosting a bandwidth of said amplifier circuit in response to detecting that said output signal is not locked in frequency to said reference signal.

12. The phase locked loop of claim 11, wherein said amplifier circuit comprises:
a first amplifier having a first input coupled to said first node, a second input for receiving a first reference voltage, and an output coupled to said second node; and
a second amplifier having a first input coupled to said first node, a second input for receiving a second reference voltage, a control input for receiving an enable signal, and an output coupled to said second node.

13. The phase locked loop of claim 12, wherein said lock detector compares said feedback signal to said reference clock signal and provides said enable signal when said feedback signal has not yet locked in frequency to said reference clock signal.

14. The phase locked loop of claim 13, wherein said lock detector further has an input for defining a width of a locking window, and said feedback signal is locked in frequency to said reference signal a predetermined edge of said feedback signal is within said width of said locking window.

15. The phase locked loop of claim 14, wherein said amplifier circuit has a first gain while said phase locked loop has not yet locked said feedback signal to said reference signal in frequency, and a second gain less than said first gain after said phase locked loop has locked said feedback signal to said reference signal in frequency.

16. The phase locked loop of claim 14, wherein said first and second amplifiers are operational transconductance amplifiers coupled to said second node through a summer.

17. A method comprising:
comparing a feedback clock signal to a reference clock signal;
pumping charge into a first loop filter at a first rate based on said comparing to develop a first voltage;
pumping charge into a second loop filter at a second rate based on said comparing to develop a second voltage, said second rate higher than said first rate;
generating an output signal at an output frequency in response to said first and second voltages;
dividing said output signal in frequency to provide said feedback clock signal;
receiving an input for defining a width of a locking window;
detecting whether said feedback clock signal is locked in frequency to said reference clock signal, wherein said feedback clock signal is locked in frequency to said reference clock signal when a predetermined edge of said feedback clock signal is within a width of said locking window of a corresponding edge of said reference clock signal; and
increasing said second rate while said feedback clock signal is not locked in frequency to said reference clock signal.

18. The method of claim 17, wherein said pumping charge into said second loop filter comprises:
continuously pumping charge into said second loop filter in response to a voltage of said first loop filter; and
selectively pumping additional charge into said second loop filter in response to a voltage of said first loop filter.

19. The method of claim 18, wherein said selectively pumping comprises:
pumping said additional charge into said second loop filter in response to said voltage of said first loop filter while said feedback clock signal is not locked in frequency to said reference clock signal.

20. The method of claim 18, wherein said selectively pumping comprises:
selectively pumping said additional charge into said second loop filter at a programmable rate.

* * * * *